United States Patent
Glibbery et al.

(10) Patent No.: US 9,584,147 B2
(45) Date of Patent: Feb. 28, 2017

(54) ISOLATOR SYSTEM SUPPORTING MULTIPLE ADCS VIA A SINGLE ISOLATOR CHANNEL

(71) Applicant: ANALOG DEVICES GLOBAL, Hamilton (BM)

(72) Inventors: Adam Glibbery, Valencia (ES); John O'Dowd, Crecora (IE); Nicola O'Byrne, Carrigaline (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/831,731

(22) Filed: Aug. 20, 2015

(65) Prior Publication Data
US 2016/0056829 A1 Feb. 25, 2016

Related U.S. Application Data

(60) Provisional application No. 62/040,913, filed on Aug. 22, 2014.

(51) Int. Cl.
*H03M 1/12* (2006.01)
*H03M 5/12* (2006.01)
(Continued)

(52) U.S. Cl.
CPC ............ *H03M 1/123* (2013.01); *H03M 1/12* (2013.01); *H03M 5/12* (2013.01); *H03M 1/188* (2013.01); *H03M 3/398* (2013.01)

(58) Field of Classification Search
CPC ........ H03M 1/123; H03M 5/12; H03M 3/398; H03M 1/188; H03M 1/12
(Continued)

(56) References Cited

U.S. PATENT DOCUMENTS

| 4,845,421 A | 7/1989 | Howarth et al. |
| 4,901,275 A | 2/1990 | Hardie et al. |

(Continued)

FOREIGN PATENT DOCUMENTS

| CN | 1830199 A | 9/2006 |
| CN | 101965686 A | 2/2011 |

(Continued)

OTHER PUBLICATIONS

Analog Devices, "Isolated Sigma-Delta Modulator", AD7400 Datasheet, Rev. G., Jun. 2013, 20 pages.
(Continued)

*Primary Examiner* — Brian Young
(74) *Attorney, Agent, or Firm* — Schwegman Lundberg & Woessner, P.A.

(57) ABSTRACT

In an isolation system, different analog to digital converters ("ADCs") are provided on a first side of an isolation barrier. Outputs from the ADCs may be merged into a common data stream and communicated across the isolation barrier by a single isolation device. The ADCs may sample independent signals or may sample a common signal. When the ADCs sample a common signal, the system may monitor the input signal for fault conditions. During no fault operation, results of an analog-to-digital conversion may be communicated across an isolation barrier by an isolation device. During a fault condition, data representing the fault condition may replace the ADC data in communication across the isolation barrier. Fault conditions may be signaled by unique data patterns that can be distinguished from ADC data.

49 Claims, 8 Drawing Sheets

(51) Int. Cl.
  *H03M 1/18* (2006.01)
  *H03M 3/00* (2006.01)
(58) Field of Classification Search
  USPC .................................................. 341/155, 159
  See application file for complete search history.

(56) References Cited

U.S. PATENT DOCUMENTS

| | | | |
|---|---|---|---|
| 5,384,808 | A | 1/1995 | Van Brunt et al. |
| 5,594,329 | A * | 1/1997 | van Ettinger ............ G01R 1/30 324/118 |
| 5,886,573 | A | 3/1999 | Kolanek |
| 5,940,447 | A | 8/1999 | Connell et al. |
| 5,952,849 | A | 9/1999 | Haigh |
| 6,167,132 | A | 12/2000 | Krone et al. |
| 6,191,717 | B1 * | 2/2001 | Scott ................... H04B 14/062 341/143 |
| 6,519,339 | B1 | 2/2003 | Sacca et al. |
| 6,873,065 | B2 | 3/2005 | Haigh et al. |
| 7,061,421 | B1 | 6/2006 | Xiao et al. |
| 7,075,329 | B2 | 7/2006 | Chen et al. |
| 7,447,492 | B2 | 11/2008 | Dupuis |
| 7,515,076 | B1 | 4/2009 | Singh et al. |
| 7,675,444 | B1 | 3/2010 | Smith et al. |
| 7,738,568 | B2 | 6/2010 | Alfano et al. |
| 8,089,311 | B2 | 1/2012 | Chen |
| 8,576,104 | B2 * | 11/2013 | Steensgaard-Madsen H03M 1/0682 341/155 |
| 2004/0080885 | A1 | 4/2004 | Gaksch et al. |
| 2004/0264941 | A1 | 12/2004 | Hirasaka |
| 2006/0199620 | A1 | 9/2006 | Greene et al. |
| 2008/0267301 | A1 | 10/2008 | Alfano et al. |
| 2009/0113222 | A1 | 4/2009 | Lee |
| 2009/0212759 | A1 | 8/2009 | Melanson |
| 2009/0243683 | A1 | 10/2009 | Ochi et al. |
| 2010/0141282 | A1 | 6/2010 | Heath et al. |
| 2010/0246646 | A1 | 9/2010 | Gaalaas |
| 2010/0250820 | A1 | 9/2010 | Gaalaas et al. |
| 2011/0189952 | A1 | 8/2011 | Barrenscheen et al. |
| 2013/0027107 | A1 | 1/2013 | Nohara |
| 2013/0088264 | A1 | 4/2013 | Barrenscheen et al. |
| 2013/0201050 | A1 | 8/2013 | Hellsten |
| 2013/0278438 | A1 | 10/2013 | Mueck |
| 2013/0294111 | A1 | 11/2013 | Persson et al. |

FOREIGN PATENT DOCUMENTS

| | | |
|---|---|---|
| WO | 2004112371 A1 | 12/2004 |
| WO | 2009108603 A1 | 9/2009 |

OTHER PUBLICATIONS

Analog Devices, D. O'Sullivan et al., "Isolated Motor Control Feedback Using the ADSP-CM402F/ADSP-CM403F/ADSP-CM407F/ADSP-CM408F SINC Filters and the AD7401A", Application Note AN-1265, Rev. A, Nov. 2013, 16 pages.

Analog Devices, "Converters for Motor Control", 8 pages, 2005.

Analog Devices, "Using the AD7400A Isolated Sgma-Delta Modulator as an Isolated Amplifier", 2 pages, 2009.

* cited by examiner

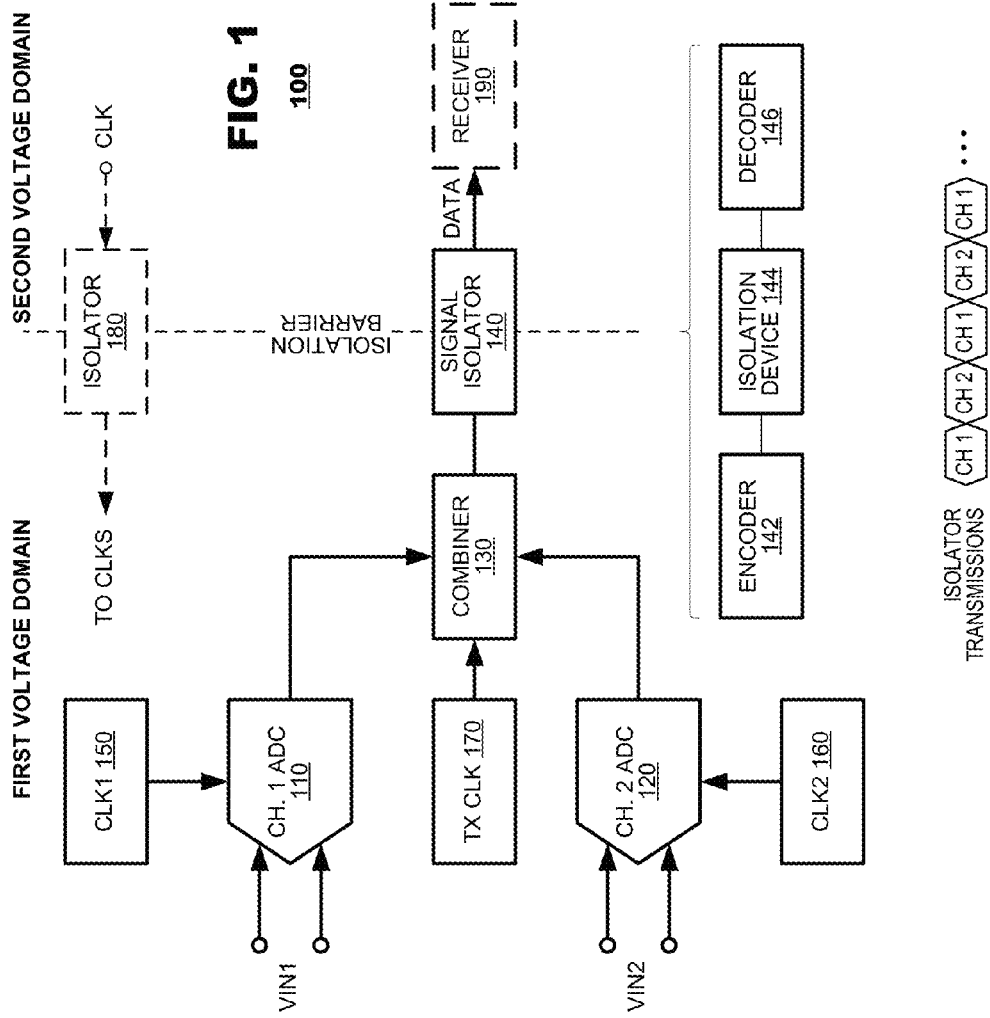

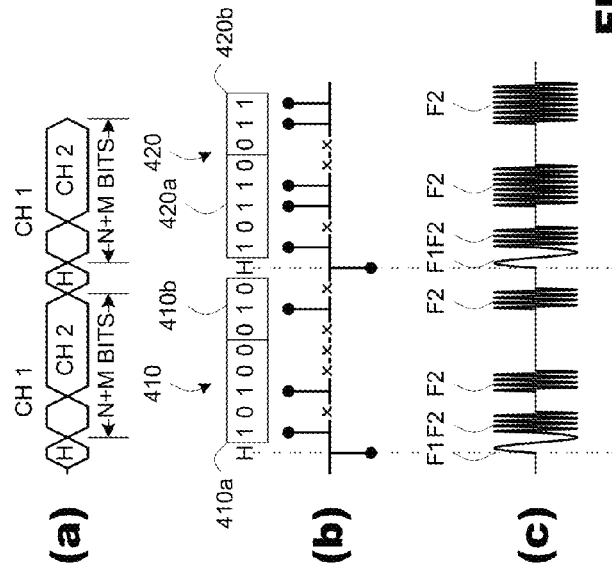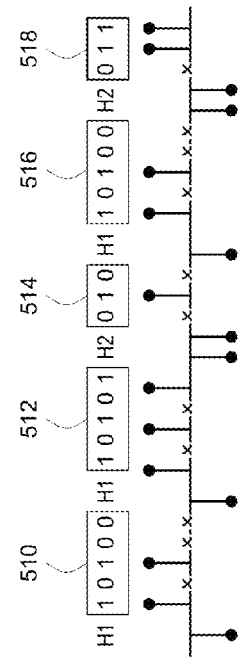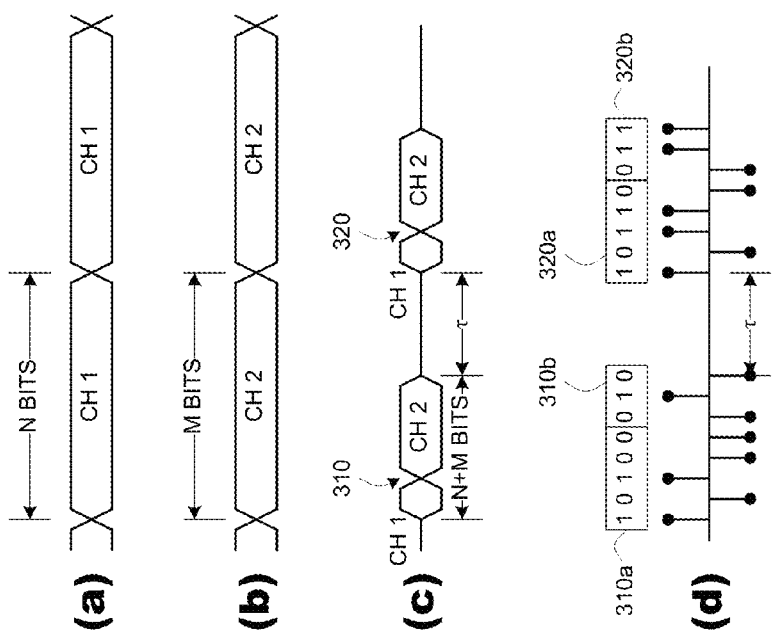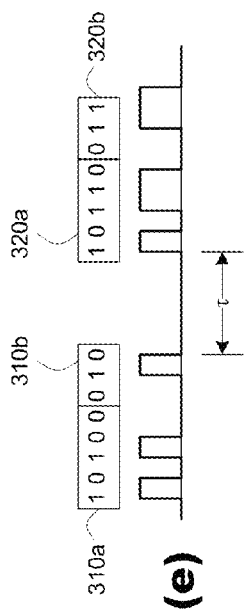

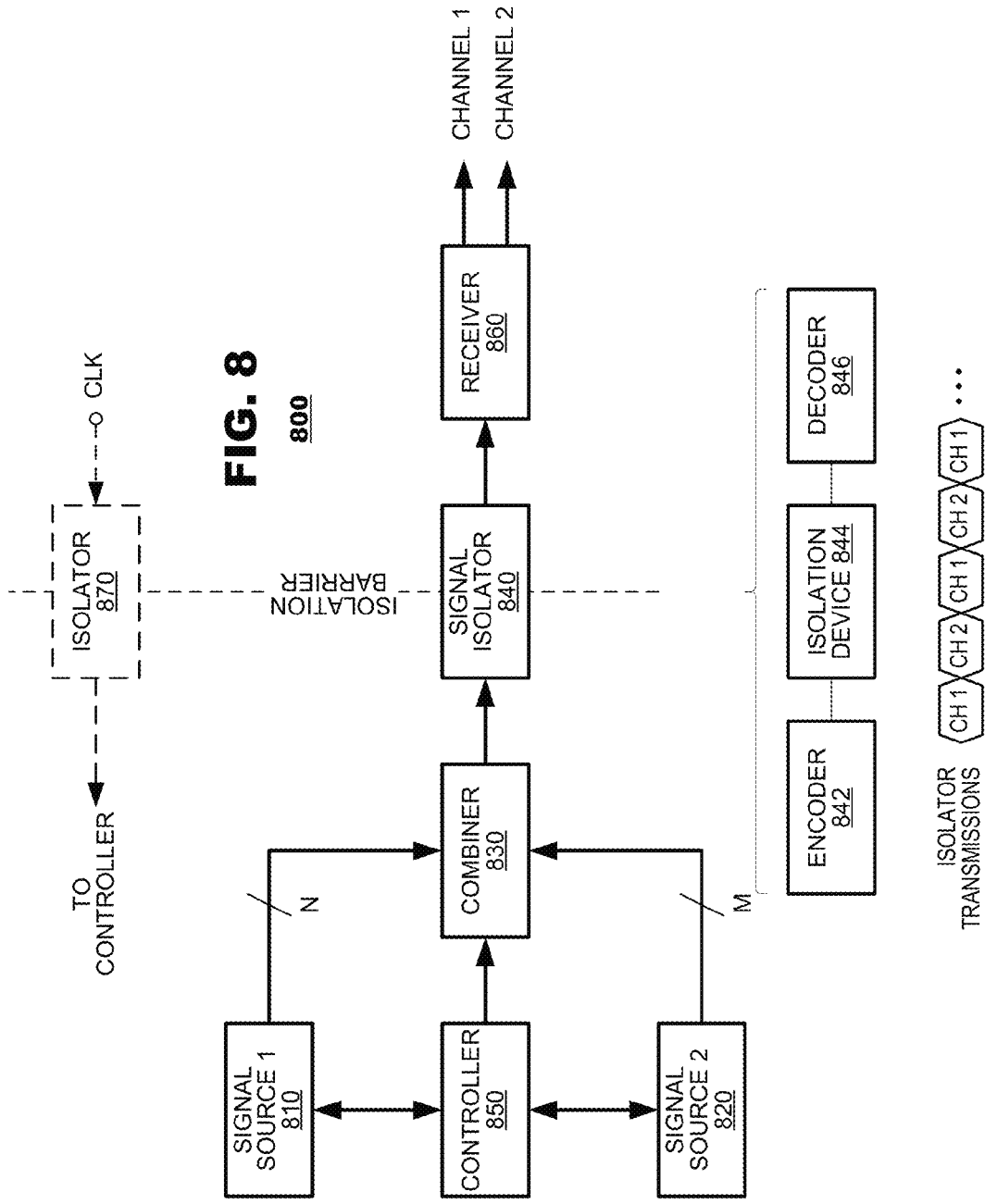

900

1200

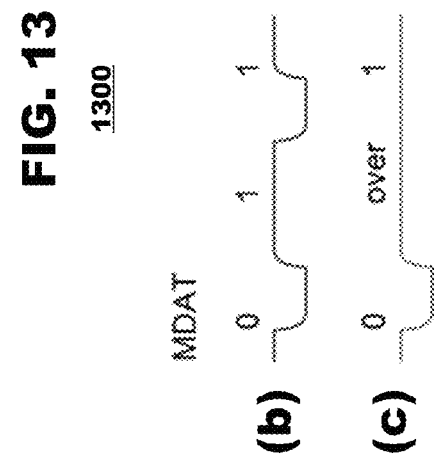
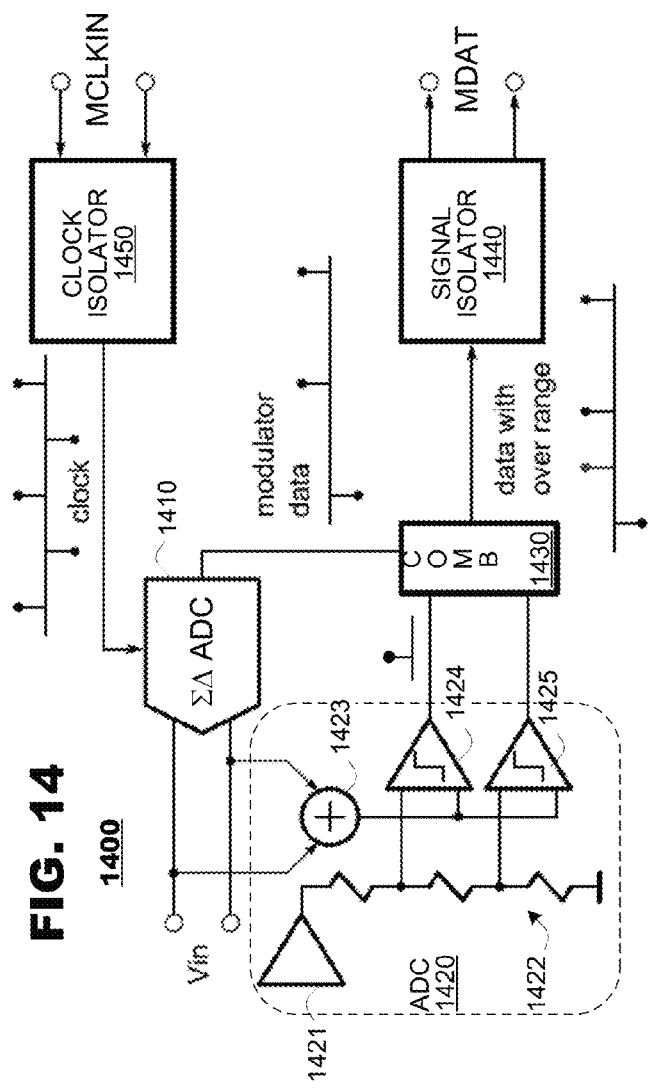

ISOLATOR SYSTEM SUPPORTING MULTIPLE ADCS VIA A SINGLE ISOLATOR CHANNEL

CLAIM FOR PRIORITY

The present application benefits from priority of patent application Ser. No. 62/040,913, filed on Aug. 22, 2014 and entitled "Isolator System Supporting Multiple ADCs Via a Single Isolator Channel," the disclosure of which is incorporated herein in its entirety.

BACKGROUND

Isolators are devices that exchange data signals between two galvanically-isolated circuit systems. The circuit systems each operate in different voltage domains, which may include different source potentials and different grounds. Isolation devices may provide data exchange across an isolation barrier, which maintains the galvanic isolation. Typical isolation devices include micro-transformers, capacitors, magneto-resistors/giant magneto-resistors and opto-electronic devices.

Isolators find application in electrical environments where operating voltages exceed the voltage limits of integrated circuits. Control systems for electrically-driven motors represent one example where an isolation device may be used. Voltages of several hundred volts may be required to drive a motor. These same voltages destroy modern integrated circuits where breakdown voltages often are five volts are less. Accordingly, isolation devices are employed to protect circuit systems with low voltage tolerances from higher voltages in other circuit systems.

BRIEF DESCRIPTION OF THE DRAWINGS

FIG. 1 illustrates an isolator system according to an embodiment of the present disclosure.

FIGS. 2-7 illustrate various signaling protocols that may be employed with the multiplexed isolator systems discussed in the present disclosure.

FIG. 8 illustrates an isolator system according to another embodiment of the present disclosure.

FIG. 13 illustrates exemplary signal that may be process by an isolator system according to another embodiment of the present disclosure.

FIG. 14 illustrates an isolator system according to another embodiment of the present disclosure.

DETAILED DESCRIPTION

Figure 6:
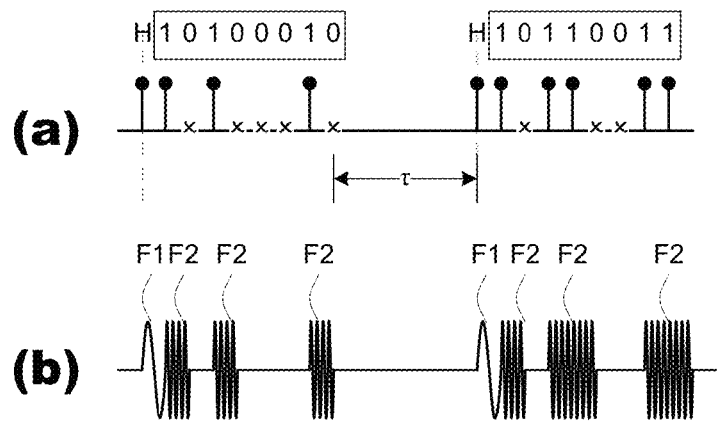

Embodiments of the present disclosure provide an isolation system in which different analog to digital converters ("ADCs") are provided on a first side of an isolation barrier. Outputs from the ADCs may be merged into a common data stream and communicated across the isolation barrier by a single isolation device. The ADCs may sample independent signals or may sample a common signal.

Other embodiments of the present disclosure provide an isolation system in which a circuit system performs analog-to-digital conversion of an input signal and also monitors the input signal for fault condition(s). During no fault operation, results of the analog-to-digital conversion may be communicated across an isolation barrier by an isolation device. During a fault condition, data representing the fault condition may replace the ADC data in communication across the isolation barrier. Fault conditions may be signaled by unique data patterns that can be distinguished from ADC data.

FIG. 1 illustrates an isolator system 100 according to an embodiment of the present disclosure. The system 100 may include a pair of analog to digital converters (ADCs) 110, 120, a combiner 130, and a signal isolator 140. The signal isolator 140 may span an isolation barrier that divides the system into two voltage domains—a first voltage domain that includes the ADCs 110, 120 and the combiner 130 and a second voltage domain that includes other components such as a receiver 190.

The ADCs 110, 120 each may sample a respective input signal VIN1, VIN2 and generate a digital code therefrom, which may be output to the combiner 130. Timing of each ADC's conversion operations may be governed by a respective clock 150, 160. Frequencies of the clocks 150, 160 may be set according to individual application needs and may be different from each other if needed.

The combiner 130 may merge digital outputs from the ADCs 110, 120 into a common data stream. The combiner 130 may transfer the merged data stream to the signal isolator 140 for transmission across an isolation barrier. The combiner 130 may transfer data at a rate determined by a transmit clock 170.

As indicated, the signal isolator 140 may transmit the merged ADC data across an isolation barrier. Isolator transmissions may toggle between channel 1 data, which may represent the output of ADC 110, and channel 2 data, which may represent the output of ADC 120. In the example of FIG. 1, the channel 1 and channel 2 data transmissions are illustrated as having common duration. Other embodiments permit asymmetrical data transmissions in applications, for example, where one ADC 110 is clocked at a higher rate than the other ADC 120 or where one ADC 110 generates a larger bit-width output than the other ADC 120.

The isolator 140 may include encoder circuitry 142, an isolator device 144 and decoder circuitry 146. Encoder circuitry 142 on a transmission side of the isolation barrier may encode digital data received from the combiner 130 into a format appropriate for transmission across the isolation device 144. The isolation device 144 may provide voltage isolation between components on either side of the isolation barrier. Typical isolation media include micro-transformers, capacitors, magneto-resistors/giant magneto-resistors and opto-electronic devices. The format of signals provided by the encoder circuitry 142 to the isolation device 144 may vary according to the type of isolation device 144 that is employed and other design motivations.

On a reception side of the isolation barrier, the isolator 140 may include decoder circuitry 146 to decode signals received from the isolation device 144 and generate digital data therefrom. Again, the format of signals received by the decoder circuitry 146 may vary according to the type of isolation device 144 that is employed and other design motivations.

In an embodiment, the clocks 150-170 may be generated locally on the same side of an isolation barrier in which the ADCs 110, 120 and the combiner 130 reside. In other embodiments, however, one or more of the clock signals may be derived from a clock signal that is supplied from a far side of the isolation barrier and transmitted via a second isolator 180, called a "clock isolator" herein. Use of a clock isolator 180 may be convenient in certain applications because it may provide a common timing reference for circuitry on both sides of the isolation barrier.

In another embodiment, the transmission clock 170 may be transmitted across a clock isolator 180 from the first voltage domain to the second voltage domain (path not shown) to provide a common timing reference for circuitry on both sides of the isolation barrier.

The principles of the present disclosure find application with a variety of different ADC architectures, including sigma-delta ADCs ("ΣΔ-ADCs"), flash ADCs, successive approximation register ("SAR") ADCs, ramp-compare ADCs, pipeline ADCs or even ADCs built from basic comparators. The ADCs may generate single bit outputs, for example in the case of ΣΔ-ADCs or comparator-based ADCs, or they may generate multi-bit outputs. The two ADCs 110, 120 may be different types of ADCs, as discussed below.

In one embodiment, the ADCs may have different output codes as time progresses for the same input signal. Differences in ADC architecture, for example, using a ΣΔ-ADC for a first ADC and a flash ADC for a second ADC may provide different discrete time waveforms of output codes where the frequency behavior within a specified bandwidth is almost identical but can be very different outside of this. As discussed herein, a ΣΔ-ADC signal may respond more slowly to a time-varying input than a flash ADC would respond to a similar time-varying input. Alternatively, the ADCs may have different conversion speeds. Alternatively the signal transfer function of the converter may have some specified frequency characteristic such as attenuation at frequencies above a particular frequency often called the input bandwidth.

In another embodiment, the ADCs may have different resolutions in their outputs. As one example, a first ADC may generate an N-bit output within a given input range but a second ADC may generate an M-bit output (M≠N) within the same input range as the first ADC. The difference in the ADCs' outputs represents different quantization step sizes at work in the two ADCs. As another example, a first ADC may operate according to a uniform quantization step size whereas a second ADC may operate according to a non-uniform quantization step size. As another example, in the case of sigma delta, information about the internal state at any point in time of the ADC is represented in a word whose width is specific to that ADC implementation.

In a further embodiment, the ADCs may have different noise floors. As one example, before conversion, a first ADC may introduce into its input signal a first time-varying noise signal with a first root mean squared (RMS) characteristic and a second ADC may introduce a different time-varying noise signal with its own RMS characteristic. Generally, the noise floors of the two ADCs will be tailored to the expected signals that they will convert; the noise floors may be set to be lower than the spectral power density of their respective input signals. Thus, two ADCs with otherwise similar characteristics may introduce different amounts of noise, which are suitable to the applications for which they are to be used. White noise sources with flat power densities may be used.

In another embodiment, the ADCs may accept different spans of input signals for conversion. For example, a first ADC may convert an input signal within a span between 0-50 mV whereas a second ADC may convert an input signal in a span between −10 and 10 V. When an ADC quantizes a signal, it may add an amount of error signal; the largest SNR with this quantization error (usually called "SQNR" or "signal to quantization noise ratio") occurs with the input signal covering the full input span. The ADC may apply gain to an input signal to fill this span to achieve the largest SQNR possible.

Different spans may be accommodated, in one example, by use of ADCs with reference voltages and devices that are tailored to the respective input spans that they are to convert. In another embodiment, two ADCs may be provisioned with different front end circuits (such a gain blocks) to scale and/or shift input signals from their respective source ranges to a range that is appropriate for the ADCs. Alternatively, two ADCs may be provisioned with coding mappings tailored to the respective source ranges that they are to convert.

Provision of multiple ADCs with different operational parameters can provide operational advantages in an isolator system. For example, in a system where safety and measurement integrity are critical, it may be desirable to convert an input signal using two totally different methods, in case one method might give a flawed conversion result due to some limitation of its architecture. For example, one ADC architecture might respond differently than another in the case of an external event such as EMC. Provision of two ADCs, therefore, can guard against out of band events that could arise through abnormal system operation of other fault.

The principles of the present disclosure also find application with a variety of different signaling protocols to carry digital data across an isolation barrier. Digital bits (e.g., individual 1s and 0s in a data stream) may be coded as corresponding modulated signals for transmission across the isolation barrier. Typical signals include level-modulated signals, pulse-modulated signals, frequency modulated signals which span from simple on/off keyed (OOK) modulated signals to phase-, amplitude- and frequency-modulated signals of which there are many defined schemes. Another layer of modulation may occur, such as Manchester-coded signals or mapping from one bit representation of a code to another for purposes of error detection and/or correction, for example, Hamming codes and the like. Alternatively, digital data may be assembled into larger constructs such as data words or frames, and transmitted isolator signals may be derived from those constructs. Thus, further information can be extracted from the isolation transmission that deviate from the local word coding that allows the words to be correctly framed. The following discussion presents exemplary signaling protocols that may be accommodated by the present disclosure.

FIG. 2 illustrates exemplary signals that may be processed in one embodiment of an isolator system according to FIG. 1. In FIG. 2, graph (a) represents timing of a transmission clock 170 (FIG. 1). Graph (b) represents exemplary state of single-bit output data that may be generated from a first ADC 110 on rising transitions of the transmission clock 170. Graph (c) represents exemplary state of single-bit output data that may be generated from a second ADC 120 on falling transitions of the transmission clock 170. Graph (d) represents a data stream that may be generated by a combiner 130 for transmission by an isolator 140. In this embodiment, individual bit values are coded as respective pulses for transmission across the isolator. Graph (e) represents a received signal that may be received by a receiver 190 from the isolator 140 after it is transmitted across the isolation barrier.

As illustrated in FIG. 2, data from a first ADC (channel 1 data) and data from a second ADC (channel 2 data) may be merged for transmission across a common isolator. In the example of FIG. 2, channel 1 data may be transmitted on a rising edge of a transmission clock and channel 2 data may be transmitted on a falling edge of a transmission clock.

The principles of the present disclosure accommodate a variety of different implementations for signaling. Although FIG. 2 illustrates channel 2 data being transmitted with half-cycle offsets from the transmission times of channel 1 data, the transmission times illustrated in FIG. 2 do not constrain timing of generation of the channel 1 and channel 2 data. In one implementation, data from the ADCs 110, 120 may be sampled on an edge of the clock 170 during which they are to be transmitted. Thus, data from ADC 110 would be sampled on rising edges of the clock signal and data from the ADC 120 would be sampled on falling edges of the clock signal. Alternatively, if convenient, data from the ADCs 110, 120 may be sampled simultaneously by a common clock 170. The sampled data for one of the channels (say, channel 2) may be buffered for a half-cycle to permit it to be merged with the data of the other channel (channel 1) for transmission.

Graph (e) illustrates a pulse-based signaling protocol to transmit data across an isolation barrier. Pulse-based signaling can be convenient for transformer-based or capacitor-based isolators where the isolation device introduces distortion to signals that they carry. Other signaling protocols, however, may be employed as desired. For example, FIG. 2(f) illustrates an OOK-modulated signal in which individual data bits are coded either as an active oscillation ("on") or as an inactive signal ("off") based on the state of data to be transmitted.

The examples of FIGS. 2(e) and 2(f) illustrate isolator transmissions in which individual transmission symbols are synchronized to a transmission clock. In other embodiments, discussed hereinbelow, a transmission clock is not required.

FIG. 3 illustrates an isolator transmission protocol, according to another embodiment, in which synchronism is maintained between the first voltage domain and the second voltage domain (FIG. 1) via transmission gaps in the isolator transmission signals. FIG. 3(a), for example, illustrates a first multi-bit data signal to be transmitted having N bits, and FIG. 3(b) illustrates a second multi-bit data signal to be transmitted having M bits. In this example, N may but need not be equal to M. FIG. 3(c) illustrates a signal protocol that may be employed to transmit the N bit and M bit data signals across the isolation barrier. In this example, the N and M bit data signals may be merged into a unitary transmission stream. Successive transmissions 310, 320 of the N+M data signals may be separated by a period of inactivity having a minimum duration shown as τ.

In this embodiment, the period of inactivity τ may be detected by a receiver 190 (FIG. 1). The receiver 190, therefore, may decode the transmissions 310, 320 to recover not only the merged N+M data stream but also extract the N-bit and M-bit data signals therefrom.

FIG. 3(d) illustrates an exemplary signaling pattern that may be used in an isolator that operates according to a pulse-polarity protocol, in which the N-bit signals 310a, 320a have a duration of 5 bits and the M-bit signals 310b, 320b have a duration of 3 bits. Of course, different embodiments may employ different values of N and M as may be desired to suit individual design needs.

FIG. 3(e) illustrates an exemplary signaling pattern that may be used in an isolator that operates according to a level-modulated protocol, in which the N-bit signals 310a, 320a have a duration of 5 bits and the M-bit signals 310b, 320 have a duration of 3 bits. Again, different embodiments may employ different values of N and M as may be desired to suit individual design needs.

FIG. 4 illustrates another exemplary signaling protocol in which synchronism is maintained between the first voltage domain and the second voltage domain (FIG. 1) via use of header signals included within the isolator transmission signals. FIG. 4(a) illustrates a transmission signal that includes a header signal H, an N-bit data signal (CH1) to be transmitted and an M-bit data signal (CH2). Again, N may but need not be equal to M. The header signal may represent a transmission pattern that is distinct from the transmission patterns that are eligible to be transmitted for either the N-bit signal or the M-bit signal.

FIGS. 4(b) and 4(c) illustrate exemplary transmission patterns that may be employed to carry the header signal H, N-bit data 410a, 420a, and M-bit data 410b, 420b. The FIG. 4(b) example illustrate an application of pulse-based modulation where a header is identified by a negative polarity pulse, a 1 bit in either the N-bit signal or M-bit signal is represented by a positive polarity pulse and a 0 bit in either the N-bit signal or the M-bit signal is represented by no pulse (e.g., inactivity). In this example, a receiver 190 (FIG. 1) may distinguish the header H from other transmitted data based on its polarity and, by extension, identify the start and end points of each N+M bit transmission 410, 420. The receiver 190 also may distinguish individual bit transmission based on the activity and polarity of signals within those N+M bit transmissions 410, 420.

FIG. 4(c) illustrates an exemplary transmission patterns in a frequency modulated/OOK-based system. In this example, the header is represented by a transmission at a first frequency F1, a 1 bit in either the N-bit signal or M-bit signal is represented by a transmission at a second frequency F2, a 0 bit in either the N-bit signal or the M-bit signal is represented by no transmission (e.g., inactivity). In this example, a receiver 190 (FIG. 1) may distinguish the header H from other transmitted data based on its frequency and, by extension, identify the start and end points of each N+M bit transmission 410, 420. The receiver 190 also may distinguish individual bit transmission based on the activity and frequency of signals within those N+M bit transmissions 410, 420.

Merger of the two data streams, for example, the channel 1 and channel 2 ADC output (FIG. 1), does not require synchronism between the first and second data streams. Continuing with the N-bit and M-bit example of FIG. 3, transmission of N-bit signals may be performed asynchronously with respect to the M-bit signals through use of appropriate headers. For example, individual N-bit transmissions may be identified in an isolator signal through use of a first header signal and individual M-bit transmissions may be identified in the isolator signal through use of a second header signal that is distinct from the first header signal.

FIG. 5 illustrates an exemplary signaling pattern that employs a pair of header signals H1 and H2. In this example, H1 is represented by a single negative polarity pulse and H2 is represented by a pair of negative polarity pulses. The 1s and 0s of the N-bit and M-bit transmissions 510-518 are shown, respectively, as positive-polarity pulses and "no pulses" (inactivity). The header signals H1, H2 set initial timing reference for the data that follows so, even if the leading data was represented by an inactive signal (for example, transmissions 514, 518), the receiver still would develop a time reference.

In this example, a receiver 190 (FIG. 1) may distinguish the headers H1, H2 from each other based on the polarity and count of received transitions and, by extension, identify the start and end points of each transmission 510-518. The receiver 190 also may distinguish individual bit transmission based on the polarity and activity of signals within those transmissions 510-518.

The use of different headers to distinguish different channels of data permits an isolator system to transmit the data of the different channels at whatever rates are desired. In the example of FIG. 5, the N-bit transmissions 510, 512 and 516 are transmitted at a greater rate than the M-bit transmissions 514 and 518. Thus, the transmission rates of individual data channels across a shared isolation medium may be tailored for individual application needs.

Other embodiments permit headers H and transmission gaps τ to be used cooperatively in isolator transmission protocols. FIG. 6 provides examples where headers and transmission gaps are used in a pulse-based isolator system.

In another embodiment, merged data may be coded according to self-clocking coding techniques prior to transmission over the isolation barrier. In such an embodiment, individual data bits from the merged data stream need not be coded as individual symbols in the isolator transmission pattern. For example, merged data may be coded according to a run length limited code ("RLL"), in which a predetermined number of bits (say 8 bits) from the merged data stream may be translated to a corresponding codeword of increased length. The codewords may be chosen such that binary ones are always separated by at least a minimum number of d binary zeroes and a maximum of k binary zeroes. Occurrences of 1s in the resultant RLL data stream developed from the codewords may be represented in the isolator transmission pattern as a predetermined event (such as a pulse, an ON key, etc.) and occurrences of 0s in the RLL data stream may be represented without activity.

In this example, a receiver 190 (FIG. 1) may identify occurrences of the is in the isolator data stream based on observed activity corresponding to the transmitted symbol (e.g., the pulse, ON key, etc.). The receiver 190 may derive a pattern of 1s and 0s by measuring time between successive 1s and may reconstruct the RLL pattern therefrom. The receiver 190 further may reconstruct the source data by inverting the conversion between the RLL pattern and source data.

Figure 7:
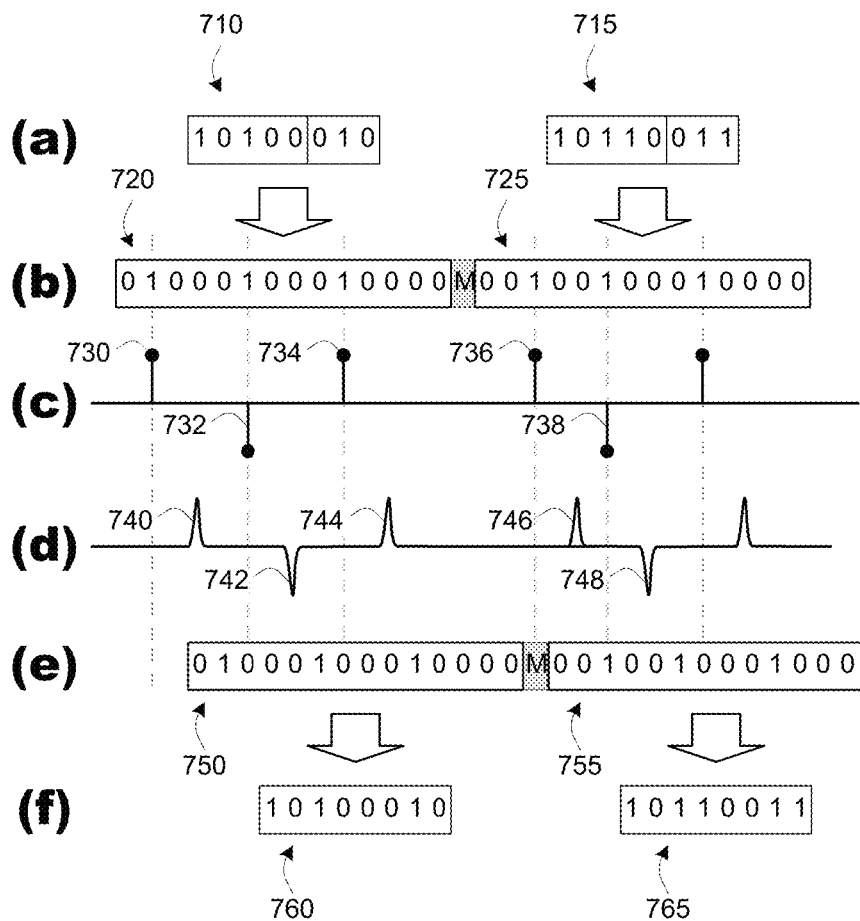

FIG. 7 illustrates exemplary application of an RLL code according to an embodiment. This example illustrates eight-to-fourteen bit modulation ("EFM") of source data. The source data stream is illustrated in FIG. 7(a). There, two 8-bit words 710, 715 of source data are illustrated, taken again from the example of FIG. 3.

FIG. 7(b) illustrates conversion of the 8-bit source words 710, 715 to respective RLL codewords 720, 725 having fourteen bits. The fourteen bit codewords are selected to ensure that no fewer than two 0s (d=2) and no more than ten 0s (k=10) appear between adjacent 1 bits. In an EFM implementation, up to three merging bits M may be inserted between codewords to guarantee the minimum and maximum distances of d and k are met when the codewords are assembled into a serial data stream.

FIG. 7(c) illustrates exemplary transmission pulses 730-738 that may be transmitted across the isolation barrier (FIG. 1). As shown, the pulses 730-738 may be generated from the 1s in the serial data stream of RLL codewords. The 0s in the serial data stream may be represented by inactivity within the isolator signaling pattern.

The pulses illustrates in FIG. 7(c) are merely exemplary. As in the earlier discussed embodiments, the signaling pattern may employ level-modulation, frequency modulation or other modulation protocols instead of pulses. Further, the signaling pattern need not employ pulses of opposite polarity; if desired, all pulses could be provided of a common polarity.

FIG. 7(d) illustrates a signaling pattern that may be received from the isolation barrier. In this example, the pulses of FIG. 7(c) may be received as pulses 740-748. From the received pattern, a receiver 190 (FIG. 1) may recover the serial RLL data stream (FIG. 7(e)) and, having recovered the RLL data stream, convert the RLL codewords to the source 8-bit data (FIG. 7(f)).

FIG. 8 illustrates an isolator system 800 according to another embodiment of the present disclosure. The system 800 may include a pair of signal sources 810, 820, a combiner 830, a signal isolator 840 and a controller 850 provided on a first side of an isolation barrier. It may include a receiver 860 provided on a second side of an isolation barrier. The two sides of the isolation barrier may be galvanically isolated from each other, each having their own supply and ground references.

The signal sources 810, 820 each may generate respective data streams to be merged and transmitted across the isolation barrier. One or both of the signal sources may include ADCs as in the embodiment of FIG. 1. Alternatively, the signal sources 810, 820 may include other signal circuitry that generates digital data to be transmitted across the isolation barrier, such as registers storing data representing the operating state of the system 800, communication circuits to transmit or reply to commands exchanged across the isolation barrier, and a processing circuitry that generates computation results to be transmitted across the isolation barrier.

The combiner 830 may merge digital outputs from the signal sources 810, 820 into a common data stream. The combiner 830 may transfer the merged data stream to the signal isolator 840 for transmission across an isolation barrier. The combiner 830 may transfer data at a rate determined by the controller 850.

As indicated, the signal isolator 840 may transmit the merged data across an isolation barrier. Isolator transmissions may toggle between channel 1 data, which may represent the output of signal source 1 810, and channel 2 data, which may represent the output of signal source 2 820. The channel 1 and channel 2 data transmissions may have common duration or, alternatively, may have asymmetrical duration as application needs warrant.

The isolator 840 may include encoder circuitry 842, an isolator device 844 and decoder circuitry 846. Encoder circuitry 842 on a transmission side of the isolation barrier may encode digital data received from the combiner into a format appropriate for transmission across the isolation device. The isolation device 844 may provide voltage isolation between components on either side of the isolation barrier. Typical isolation media include micro-transformers, capacitors, magneto-resistors/giant magneto-resistors and opto-electronic devices. The format of signals provided by the encoder circuitry to the isolation device may vary according to the type of isolation device that is employed.

On a reception side of the isolation barrier, the isolator 840 may include circuitry 846 to decode signals received from the isolation device and generate digital data therefrom. Again, the format of signals received by the decoder 846 may vary according to the type of isolation device that is employed.

Optionally, the system 800 may include other isolator(s) 870 for reception of data from the second side of the isolation barrier to the first side. The isolators 870 may carry timing information such as a clock signal and/or transmit commands from the second side of the isolation barrier.

FIG. 8 illustrates the signal sources 1 and 2 810, 820 as generating digital data of length N and M respectively. The N and M width signals may be single bit signals or multi-bit signals as desired. The signaling protocols and patterns discussed hereinabove for FIGS. 2-7 may find application in the embodiment of FIG. 8, also.

Figure 9:
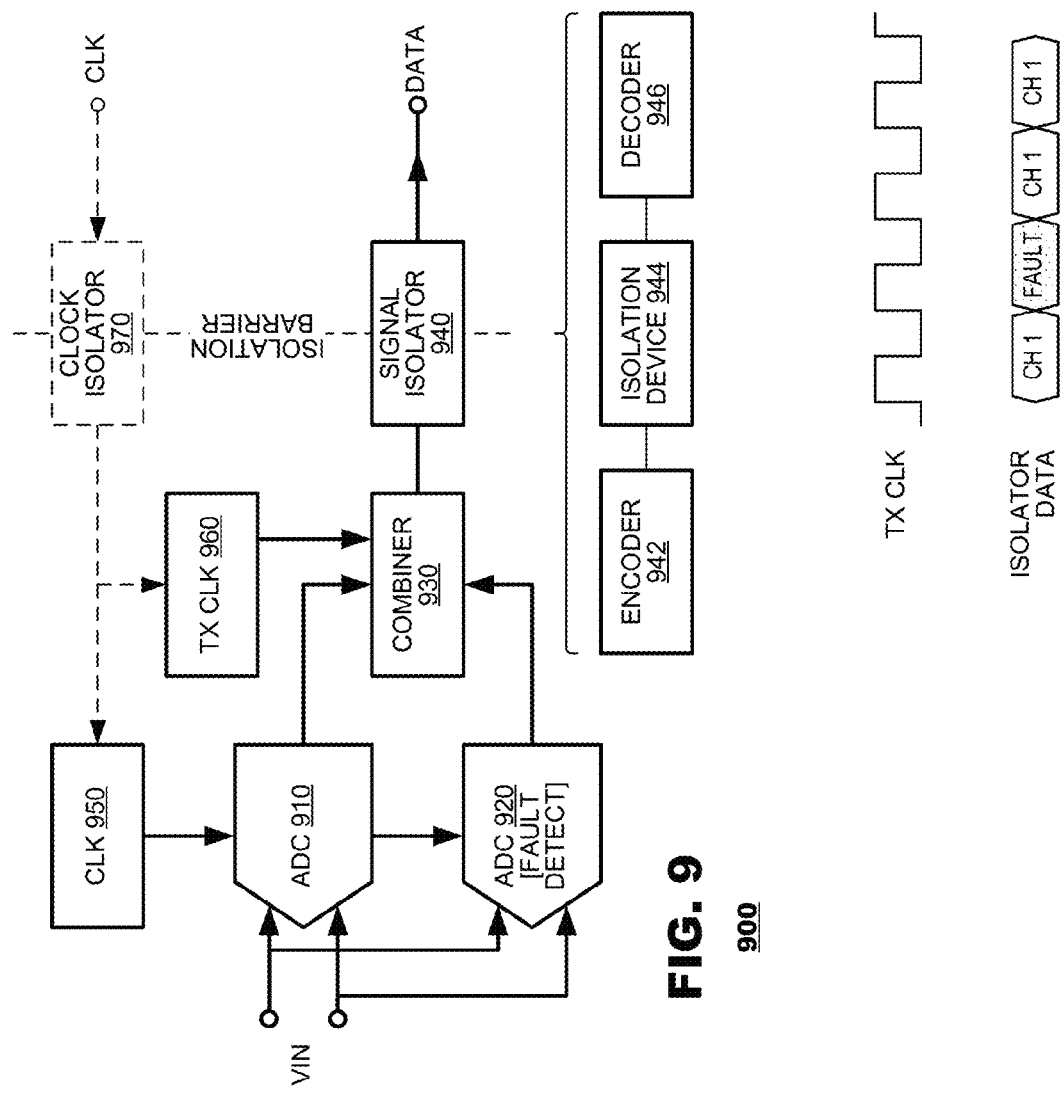
FIG. 9 illustrates another isolator system according to an embodiment of the present disclosure.

FIG. 9 illustrates another isolator system 900 according to an embodiment of the present disclosure. The isolator 900 may include a pair of ADCs 910, 920, a combiner 930; and a signal isolator 940.

In this embodiment, the ADCs 910, 920 each may sample a common input signal VIN and generate a digital code therefrom, which may be output to the combiner 930. Timing of each ADC's conversion operations may be governed by a clock 950. A frequency of the clock 950 may be set according to individual application needs.

The combiner 930 may merge digital outputs from the ADCs 910, 920 into a common data stream. The combiner 930 may transfer the merged data stream to the signal isolator 940 for transmission across an isolation barrier. The combiner 930 may transfer data at a rate determined by a transmit clock 960.

As indicated, the signal isolator 940 may transmit the merged ADC data across an isolation barrier. The isolator 940 may include encoder circuitry 942, an isolator device 944 and decoder circuitry 946. Encoder circuitry 942 on a transmission side of the isolation barrier may encode digital data received from the combiner into a format appropriate for transmission across the isolation device. The isolation device 944 may provide voltage isolation between components on either side of the isolation barrier. Typical isolation media include micro-transformers, capacitors, magneto-resistors/giant magneto-resistors and opto-electronic devices. The format of signals provided by the encoder circuitry to the isolation device may vary according to the type of isolation device that is employed.

On a reception side of the isolation barrier, the isolator 940 may include circuitry 3 946 to decode signals received from the isolation device and generate digital data therefrom. Again, the format of signals received by the decoder circuitry 946 may vary according to the type of isolation device that is employed.

In the embodiment illustrated in FIG. 9, the two ADCs 910, 920 may generate digital output data reflecting state of a common input signal. A first ADC 910 may generate a digital representation of the input signal at a higher degree of precision than the second ADC 920. The second ADC 920 may generate digital data representing state of the input signal at a faster rate than the first ADC 910. For example, the first ADC 910 may be provided as a sigma-delta ADC whereas the second ADC 920 may be provided as a SAR ADC, a flash ADC or even a basic comparator.

Provision of a "slow" ADC 910 and a "fast" ADC 920 can provide for a fast fault detection operation in the system 900 of FIG. 9. The fast ADC 920 may be set to detect voltages that exceed predetermined maximum and/or minimum voltage on the input VIN. The fast ADC 920 may generate an output that distinguishes between a fault condition (say VIN exceeding a high voltage threshold $V_{TH\_HI}$) and a no fault condition. The slow ADC 910 may be set to generate a digital output representing a voltage level of VIN that is within the operating range of the ADC (typically, up to $V_{TH\_HI}$).

The combiner 930 may merge fault indications from the fast ADC 920 with output of the slow ADC 910. In one embodiment, the combiner 930 may replace data from the slow ADC 910 with data from the fast ADC 920 when the fast ADC 920 generates an output representing a fault condition. This is illustrated in FIG. 9 where exemplary isolator data is shown as carrying channel 1 data except where a "fault" indication is present.

In an embodiment, the clocks 950-960 may be generated locally on the same side of an isolation barrier in which the ADCs 910, 920 and the combiner 930 reside. In other embodiments, however, one or more of the clock signals may be derived from a clock signal that is supplied from a far side of the isolation barrier and transmitted via a clock isolator 970. Again, use of a clock isolator 970 may be convenient by providing a common timing reference for circuitry on both sides of an isolation barrier.

In another embodiment, the transmission clock 960 may be transmitted across a clock isolator 970 (path not shown) to provide a common timing reference for circuitry on both sides of an isolation barrier.

Figure 10:
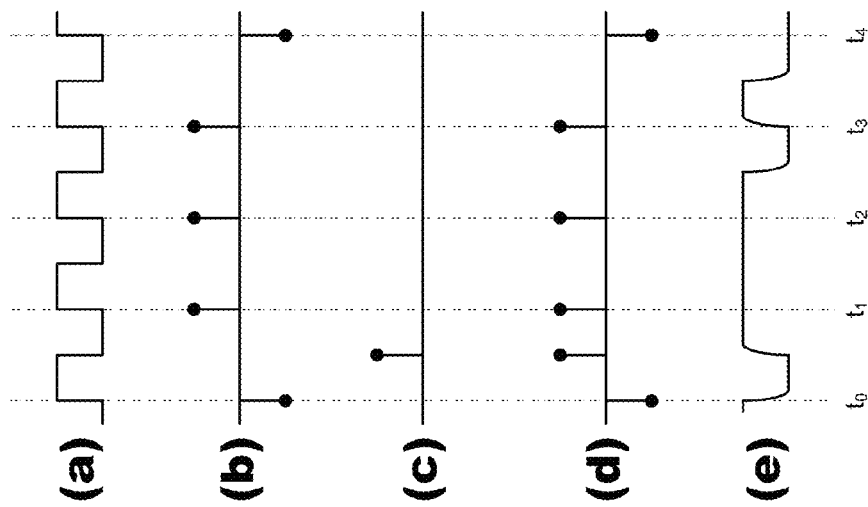
FIG. 10 illustrates exemplary signals that may be processed by an isolator system according to FIG. 9.

FIG. 10 illustrates exemplary signals that may be processed by an isolator system according to FIG. 9. In FIG. 10, graph (a) represents timing of a transmission clock. Graph (b) represents exemplary state of data that may be output from a first, slow ADC. Graph (c) represents exemplary state of data that may be output from a second, faster ADC. Graph (d) represents a data stream that may be generated by a combiner for transmission by an isolator. Graph (e) represents a transmission data stream that may be generated by the isolator for transmission across the isolation barrier.

As illustrated in FIG. 10, data from a first ADC 910 (FIG. 9), channel 1 data, and data from a second ADC 920, channel 2 data, may be merged for transmission across a common isolator 940. In the example of FIG. 10, channel 1 data may be transmitted during each cycle of a transmission clock except during those cycles where channel 2 data indicates an operational fault.

Graph (c) illustrates output from the second ADC 920 (FIG. 9). A positive pulse may represent an event where an input voltage exceeds an operational limit of the system (e.g., it exceeds a high threshold $V_{TH\_HI}$). A lack of output (no pulses) in the channel 2 data, graph (c), may represent an event where the input voltage VIN does not exceed an operational limit of the system. Although not shown in FIG. 10, the second ADC 920 may be configured to generate outputs representing other fault conditions, such as by generating a negative pulse if the input voltage falls below another operational limit of the system (e.g., it is less than a low threshold $V_{TH\_LO}$).

Graph (e) illustrates application of a Manchester-coded signaling protocol to transmit data across an isolation barrier. An input bit to be transmitted may be coded into a data pattern having two stated. In the example illustrated in FIG. 10(e), when a binary "1" is to be transmitted, it may be coded into a transmission pattern having a "1" (a high voltage) in a first half-cycle of a transmission period and having a "0" (a low voltage) in a second half-cycle of a transmission period. Exemplary "1-0" transmission patterns are illustrated in FIG. 10(e) at times $t_0$ and $t_3$. Transmission of a binary "0" may be coded into a transmission pattern having a "0" (a low voltage) in the first half-cycle of a transmission period and having a "1" (a high voltage) in a second half-cycle of a transmission period. An exemplary "0-1" transmission pattern is illustrated in FIG. 10(e) at time $t_2$. Although other transmission patterns are possible (e.g., a "1" followed by a "1" and a "0" followed by a "0"), these patterns typically are invalid coding states under the Manchester protocol.

Embodiments of the present disclosure may leverage invalid signaling patterns in a governing protocol to signal fault conditions in an isolator system. In such an embodiment, a combiner may generate a "1-1" pattern when an ADC output indicates a fault condition. This is illustrated in FIG. 10(e) at time t1. There, a fault condition is identified from a fast ADC in a preceding clock cycle (FIG. 10(c)). At time t1, a combiner 930 generates a "1-1" signal pattern which may be transmitted by the isolator. Receiver circuitry on a far side of the isolation barrier may detect the condition and generate appropriate data in response.

Embodiments of the present disclosure may use different signaling patterns that are otherwise invalid under the coding protocol to indicate different fault conditions. For example, a first fault condition representing an input voltage that exceeds a high voltage threshold ($V_{IN} > V_{TH\_HI}$) might be indicated by a "1-1" transmission pattern. A second fault condition representing an input voltage that exceeds a high voltage threshold ($V_{IN} < V_{TH\_LO}$) might be indicated by a "0-0" transmission pattern. The principles of the present disclosure accommodate other combinations of patterns as may be desired.

Manchester-coded data is considered self-clocking data because a receiver circuit can derive a timing reference from the Manchester-coded data and need not be provided with a synchronizing clock. Clock isolators may be omitted in many embodiments where a signal isolator transmits data according to a Manchester coding protocol.

Figure 11:
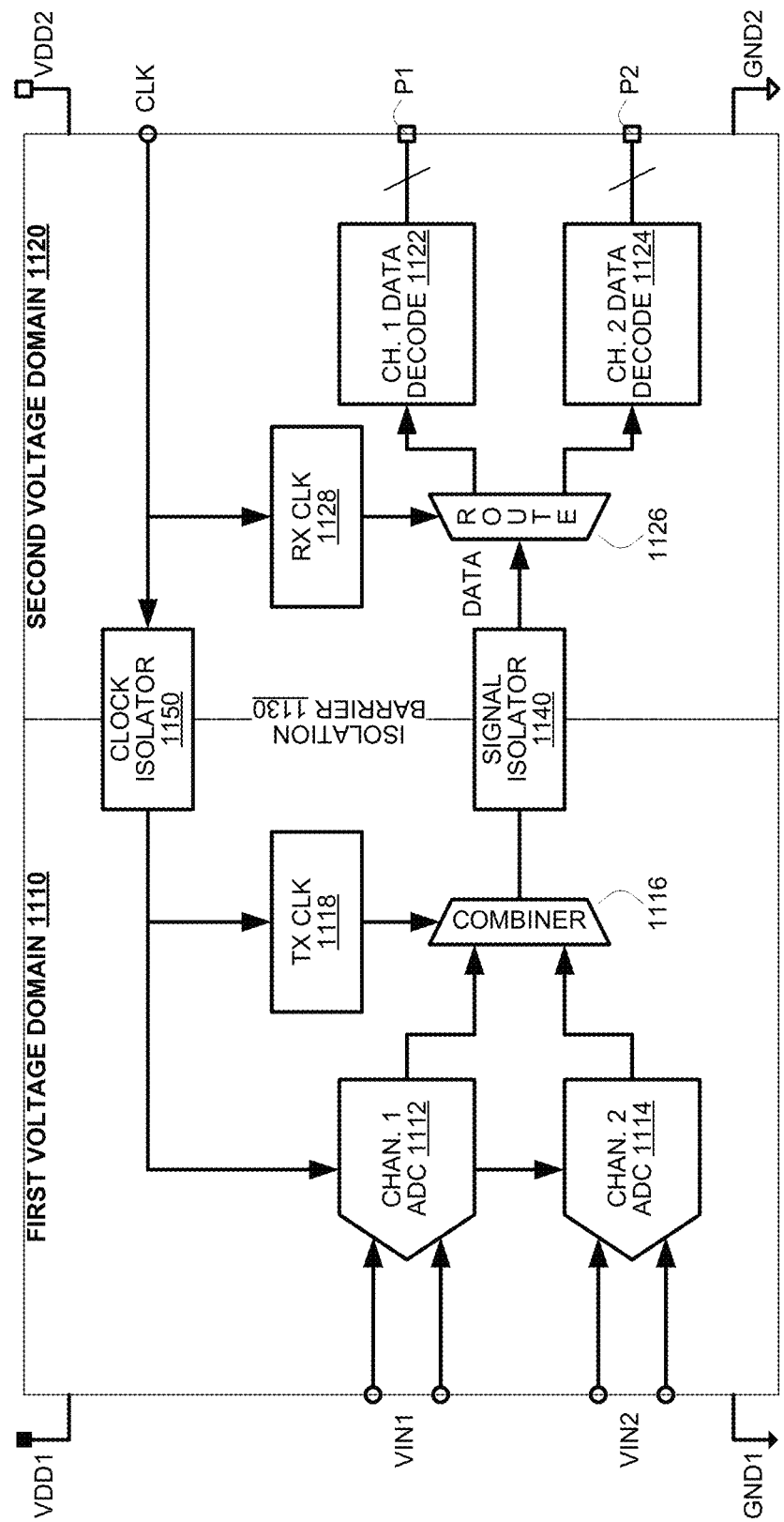
FIG. 11 illustrates an isolator system according to another embodiment of the present disclosure.

FIG. 11 illustrates an isolator system 1100 according to another embodiment of the present disclosure. The system 1100 may include first and second voltage domains 1110, 1120 that are separated by an isolation barrier 1130. Each voltage domain 1110, 1120 represents a circuit system that is galvanically isolated from the other circuit system 1120, 1110. Each voltage domain 1110, 1120 may include its own supply voltage(s) VDD1, VDD2 and its own ground reference GND1, GND2. In an embodiment, the two voltage domains 1110, 1120 may be manufactured on separate integrated circuit dies.

The first voltage domain 1110 may include a pair of analog to digital converters (ADCs) 1112, 1114, a combiner 1116, and a transmit clock 1118. The ADCs 1112, 1114 each may sample a respective input signal VIN1, VIN2 and generate a digital code therefrom, which may be output to the combiner 1116. In example of FIG. 11, timing of each ADC's conversion operations is shown as governed a common clock CLK. As discussed in other embodiments, however, the ADCs may be provided with separate driving clocks (not shown) if desired to driver the ADCs at different frequencies.

The combiner 1116 may merge digital outputs from the ADCs 1112, 1114 into a common data stream. The combiner 1116 may transfer the merged data stream to the signal isolator 1140 for transmission across an isolation barrier 1130. The combiner 1116 may transfer data at a rate determined by a transmit clock 1118.

The signal isolator 1140 may transmit the merged ADC data across an isolation barrier. Isolator transmissions may toggle between channel 1 data, which may represent the output of ADC 1112, and channel 2 data, which may represent the output of ADC 1114. Allocation of transmission bandwidth between channel 1 data and channel 2 data may be made according to the data rate of each ADC's output. For example, the channel 1 and channel 2 data transmissions each may have common duration and data rate. Other embodiments permit asymmetrical data transmissions in applications where, for example, one ADC 1112 is clocked at a higher rate than the other ADC 1114 or where one ADC 1112 generates a larger bit-width output than the other ADC 1114.

FIG. 11 illustrates an embodiment where the transmit clock is derived from a clock signal CLK received by a clock isolator 1150. In this embodiment, the CLK may serve as a basis to define a common timing reference for circuitry in both voltage domains 1110, 1120. In other embodiments, however, the transmit clock 1118 may be generated locally within the first voltage domain 1110.

The isolator 1140 may include encoder circuitry, an isolator device and decoder circuitry (not shown). Encoder circuitry on a transmission side of the isolation barrier may encode digital data received from the combiner into a format appropriate for transmission across the isolation device. The isolation device may provide voltage isolation between components on either side of the isolation barrier. Typical isolation media include micro-transformers, capacitors, magneto-resistors/giant magneto-resistors and opto-electronic devices. The format of signals provided by the encoder circuitry to the isolation device may vary according to the type of isolation device that is employed.

On a reception side of the isolation barrier, the isolator 1140 may include circuitry to decode signals received from the isolation device and generate digital data therefrom. Again, the format of signals received by the decoder circuitry may vary according to the type of isolation device that is employed.

The second voltage domain 1120 may include: first and second data decoders 1122, 1124, a router 1126, and a reception clock 1128. The system 1100 also may include a signal isolator 1140 and, optionally, a clock isolator 1150 that transfers signals across the isolation barrier 1130. Within the second voltage domain 1120, a router 1126 may segregate channel 1 data from channel 2 data and route each instance of channel data to a respective channel decoder 1122, 1124. The router 1126 may operate according to a timing reference provided by the receive clock 1128. The receive clock 1128 may derive its timing reference from the CLK signal, which allows the first and second voltage domains 1110, 1120 to operate according to a common timing reference. In an embodiment, timing references provided by the receive clock 1128 may include timing adjustments to accommodate signal propagation delays that may be introduced by the signal isolator 1140.

The channel decoders 1122, 1124 may generate signals representing content provided in the respective channels. For example, in an embodiment where the channel 1 and channel 2 ADCs 1112, 1114 are sigma-delta modulators, the decoders 1122, 1124 may include accumulators to build multi-bit digital codes from single-bit outputs of the ADCs 1112, 1114. Outputs of the channel decoders 1122, 1124 may be output from the isolator system 1100 for example, via output pins.

Figure 12:
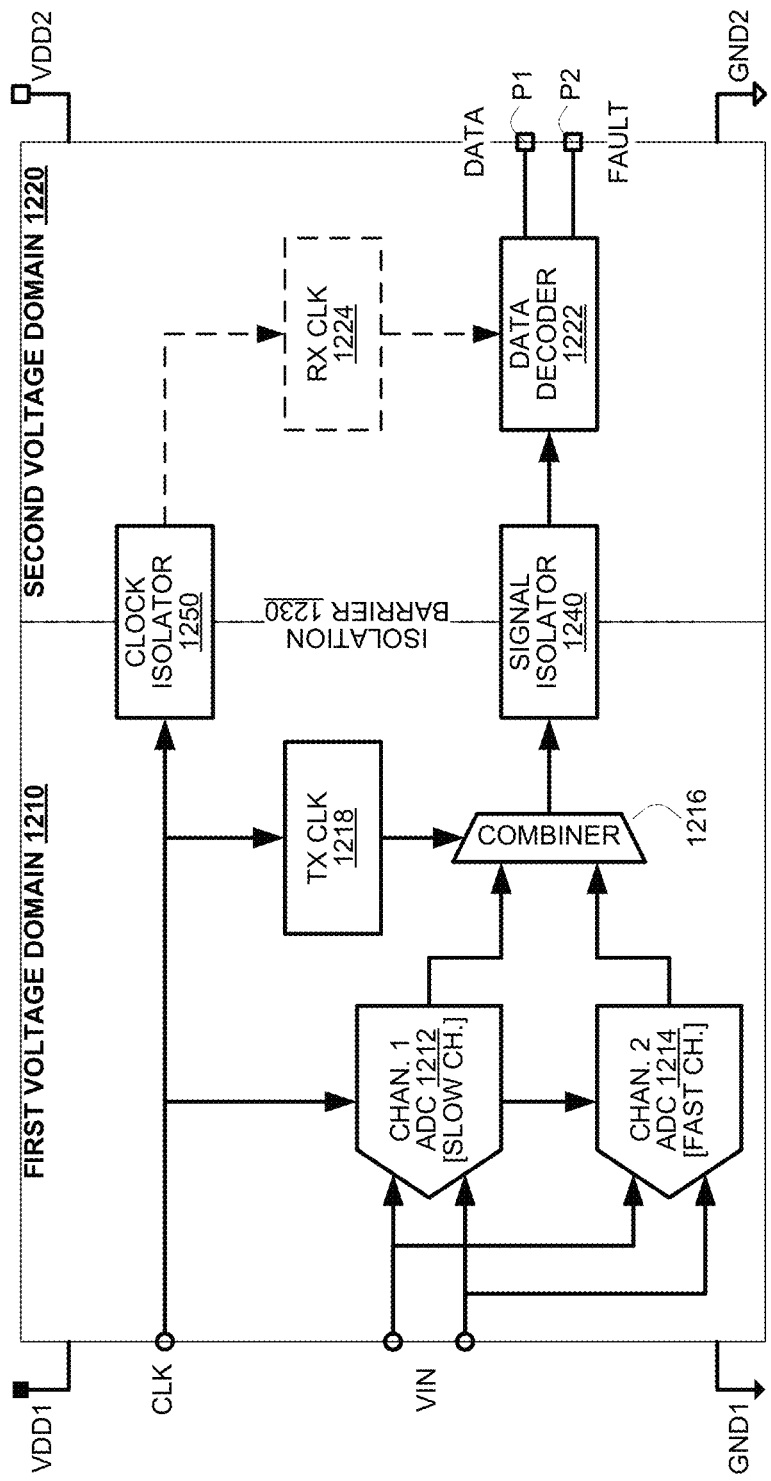
FIG. 12 illustrates an isolator system according to another embodiment of the present disclosure.

FIG. 12 illustrates an isolator system 1200 according to another embodiment of the present disclosure. The system 1200 may include first and second voltage domains 1210, 1220 that are separated by an isolation barrier 1230. Each voltage domain 1210, 1220 represents a circuit system that is galvanically isolated from the circuit system of the other voltage domain 1220, 1210. Each voltage domain 1210, 1220 may include its own supply voltage(s) VDD1, VDD2 and its own ground reference GND1, GND2. In an embodiment, the two voltage domains 1210, 1220 may be manufactured on separate integrated circuit dies.

The first voltage domain 1210 may include a pair of analog to digital converters (ADCs) 1212, 1214, a combiner 1216, and a transmit clock 1218. The second voltage domain 1220 may include a data decoder 1222, and optionally, a reception clock 1224. The system 1200 may include a signal isolator 1240 and, optionally, a clock isolator 1250 that transfers signals across the isolation barrier 1230.

Within the first voltage domain 1210, the ADCs 1212, 1214 each may sample a common input signal VIN and generate a digital code therefrom, which may be output to the combiner 1216. In the example of FIG. 12, timing of each ADC's conversion operations is shown as governed by a common clock CLK. As discussed in other embodiments, however, the ADCs may be provided with separate driving clocks (not shown), if desired, to drive the ADCs at different frequencies.

The combiner 1216 may merge digital outputs from the ADCs 1212, 1214 into a common data stream. The combiner 1216 may transfer the merged data stream to the signal isolator 1240 for transmission across the isolation barrier 1230. The combiner 1216 may transfer data at a rate determined by a transmit clock 1218.

As indicated, the signal isolator 1240 may transmit the merged ADC data across an isolation barrier 1230. The isolator 1240 may include encoder circuitry, an isolator device and decoder circuitry (not shown). Encoder circuitry on a transmission side of the isolation barrier may encode digital data received from the combiner into a format appropriate for transmission across the isolation device. The isolation device may provide voltage isolation between components on either side of the isolation barrier. Typical isolation media include micro-transformers, capacitors, magneto-resistors/giant magneto-resistors and opto-electronic devices. The format of signals provided by the encoder circuitry to the isolation device may vary according to the type of isolation device that is employed.

On a reception side of the isolation barrier, the isolator 1240 may include circuitry to decode signals received from the isolation device and generate digital data therefrom. Again, the format of signals received by the decoder circuitry may vary according to the type of isolation device that is employed.

In the embodiment illustrated in FIG. 12, the two ADCs 1212, 1214 may generate digital output data reflecting state of a common input signal VIN. A first ADC 1212 may generate a digital representation of the input signal at a higher degree of precision than the second ADC 1214. The second ADC 1214 may generate digital data representing state of the input signal at a faster rate than the first ADC 1212. For example, the first ADC 1212 may be provided as a sigma-delta ADC whereas the second ADC 1214 may be provided as a SAR ADC, a flash ADC or even a basic comparator.

Provision of a "slow" ADC 1212 and a "fast" ADC 1214 can provide for a fast fault detection operation in the isolator system 1200. The fast ADC 1214 may be set to detect voltages that exceed predetermined maximum and/or minimum voltage on the input VIN ($V_{TH\_HI}$, $V_{TH\_LO}$). The fast ADC may generate an output that distinguishes between fault conditions (VIN>$V_{TH\_HI}$ and/or VIN<$V_{TH\_LO}$) and a no fault condition. The slow ADC 1212 may be set to generate a digital output representing a voltage level of VIN that is within the operating range of the ADC (typically, $V_{TH\_HI}$>$V_{IN}$>$V_{TH\_LO}$).

The combiner 1216 may merge fault indications from the fast ADC 1214 with output of the slow ADC 1212. In one embodiment, the combiner 1216 may replace data from the slow ADC 1212 with data from the fast ADC 1214 when the fast ADC 1214 generates an output representing a fault condition.

Within the second voltage domain 1220, data from the signal isolator 1240 may be input directly to a data decoder 1222. The data decoder 1222 may interpret the signals is receives to distinguish fault data in the transmission signal from other ADC content. The data decoder 1222 may generate a data signal representing a digital representation of the input signal. For example, in an embodiment where the slow ADC 1212 is a sigma-delta ADC, the decoder 1222 may include an accumulator to build a multi-bit digital code from single-bit outputs of the ADC 1212.

When operational faults are recognized from within the transmission data, the data decoder 1222 may generate fault indications in its output.

In the embodiment illustrated in FIG. 12, the clock signal CLK may be input to the isolator at the first voltage domain 1210. The transmit clock 1218 may be derived from the CLK signal and may govern transmit operations within the first voltage domain 1210. The CLK signal may be transmitted to the second voltage domain 1220 via a clock isolator 1250. Timing of reception operations in the second voltage domain 1220 may be synchronized to the CLK signal that is transmitted across the isolation barrier 1230. Thus, again, use of a clock isolator 1250 may be convenient by providing a common timing reference for circuitry on both sides of an isolation barrier. In another embodiment, the CLK signal may be transmitted from the second voltage domain 1220 to the first voltage domain 1210 across the clock isolator 1250 (path not shown) to provide a common timing reference for circuitry on both sides of an isolation barrier.

Alternatively, FIG. 12 may employ a Manchester-encoded transmission protocol in which case the reception clock 1224 may be omitted. In this case, the signal isolator 1240 may provide a timing reference for operations of the data decoder 1222.

The principles of the present disclosure accommodate other types of fault detectors in an isolator system. For example, although not shown in FIG. 12, a fault detector may be provided as a temperature sensor that detects when circuitry in the first voltage domain 1210 exceeds an operating temperature limit. Alternatively, a fault detector may be provide as a voltage sensor that detects when a supply voltage VDD1 exceeds or falls below operational limits for supplies. The present disclosure accommodates other types of fault detectors which may be common in integrated circuit design. In such applications, when a fault detector identifies a fault condition has occurred, the fault detector may generate an indication to a signal combiner 1216, which may cause an encoder 942 (FIG. 9) to code the fault condition with a signaling pattern that is invalid according to a governing coding protocol.

FIG. 13 illustrates an exemplary signaling pattern in which a fault condition generates an invalid pattern ("over") according to Manchester-coding.

FIG. 14 illustrates an isolator system 1400 according to another embodiment of the present disclosure. The isolator system 1400 finds application in the embodiments of FIG. 9 or FIG. 12. The isolator 1400 may include a pair of ADCs 1410, 1420; a combiner 1430; and a signal isolator 1440. The isolator 1400 may operate in accordance with the embodiment of FIG. 9.

In the embodiment of FIG. 14, the first ADC 1410 may be provided as a sigma-delta ADC. It would operate as a slow ADC in the foregoing discussion.

In the embodiment of FIG. 14, the second ADC 1420 may operate as a fast ADC in the foregoing discussion. The second ADC may include a source of a reference voltage 1421, a voltage divider 1422, an optional input circuit 1423, and a pair of comparator 1424, 1425

The voltage divider 1422 may generate a pair of reference voltages at intermediate nodes within the voltage divider 1422. The second ADC 1420 may use these reference voltages as high and low thresholds for comparison (e.g., $V_{TH\_HI}$, and $V_{TH\_LO}$). The comparators 1424, 1425 may compare a representation of the input voltage VIN to these threshold voltages. Outputs of the comparators 1424, 1425 may be output to the combiner 1430 for use in signaling across the isolation barrier.

If desired, the input circuit 1423 may scale down the input voltage prior to application to the comparators 1424, 1425. Isolator devices oftentimes are used in electrical environments where the voltages being measured exceed the voltage limits of the circuits that perform the voltage measurements. Accordingly, an input voltage that is expected to be several tens or hundreds of volts may be scaled down to a single volt before being input to the second ADC.

The second ADC 1420 may generate a multi-bit output representing the result of its comparisons, which may be interpreted by the combiner 1430 to determine whether to overwrite data from the first ADC 1410. Table 1 illustrates outputs from the second ADC 1420 as illustrated in FIG. 14 and the states that they represent.

TABLE 1

| OUTPUT OF COMPARATOR 1424 | OUTPUT OF COMPARATOR 1425 | STATE |
|---|---|---|
| 1 | 1 | Fault: VTH_HI < VIN |
| 0 | 1 | No Fault: VTH_HI > VIN > VTH_LO |
| 0 | 0 | Fault: VIN < VTH_LO |

Several embodiments of the disclosure are specifically illustrated and/or described herein. However, it will be appreciated that modifications and variations of the disclosure are covered by the above teachings and within the purview of the appended claims without departing from the spirit and intended scope of the disclosure.

We claim:

1. An isolator system, comprising:
   a plurality of analog to digital converters (ADCs), wherein at least two ADCs have different conversion times,
   a signal combiner to merge outputs of the ADCs into a single data stream, and
   a signal isolator, bridging an isolation barrier, to carry the merged data stream from a first side of the isolation barrier to a second side of the isolation barrier.
2. The system of claim 1, wherein the ADCs have different signal bandwidths.
3. The system of claim 1, wherein the ADCs have different resolutions of their digital outputs.
4. The system of claim 1, wherein the ADCs have different noise floors.
5. The system of claim 1, wherein the ADCs accept input signals having different spans.
6. The system of claim 1, wherein the ADCs have different architectures.
7. The system of claim 1, wherein the ADCs generate multi-bit outputs of different bit widths.
8. The system of claim 1, wherein the ADCs have inputs coupled to different signal sources.
9. The system of claim 1, wherein the ADCs have inputs coupled to a common signal source.
10. The system of claim 9, wherein the signal isolator transmits the merged data stream as a Manchester-coded signal in which:
    data from a first ADC is represented according to Manchester-coding, and data from a second ADC, when the second ADC's output is in a predetermined state, replaces an instance of Manchester-coded output from the first ADC with a signaling pattern that is invalid under Manchester coding.
11. The system of claim 1, wherein the signal isolator transmits the merged data stream as a run length limited coded signal.
12. The system of claim 1, wherein the merged data stream includes data from the ADCs framed by a transmission gap of inactivity.
13. The system of claim 1, wherein the merged data stream includes data from the ADCs framed by a header signal.
14. The system of claim 1, further comprising a clock isolator that carries a clock signal from the second side of the isolation barrier to the first side of the isolation barrier.
15. The system of claim 1, further comprising a transmit clock coupled to the combiner.
16. A method, comprising:
    generating digital outputs from a plurality of analog-to-digital converters (ADCs), including generating multi-bit outputs of different bit widths using at least two ADCs,
    merging the digital outputs from the ADCs into a single data stream,
    generating an isolator signaling pattern from the merged data stream, and
    transmitting the isolator signaling pattern across an isolation barrier.
17. The method of claim 16, wherein the ADCs have different speeds in response to changing inputs.
18. The method of claim 16, wherein the ADCs have different resolutions of their digital outputs.
19. The method of claim 16, wherein the ADCs have different noise floors.
20. The method of claim 16, wherein the ADCs accept input signals having different spans.
21. The method of claim 16, rein the ADCs have different architectures.
22. The method of claim 16, comprising:
    coupling inputs of the ADCs to different signal sources.
23. The method of claim 16, comprising:
    coupling inputs of the ADCs to a common signal source.
24. The method of claim 23, wherein the isolator signaling pattern is a Manchester-coded signal in which:
    data from a first ADC is represented according to Manchester-coding, and data from a second ADC, when the second ADC's output is in a predetermined state, replaces an instance of Manchester-coded output from the first ADC with a signaling pattern that is invalid under Manchester coding.
25. The method of claim 16, wherein the merged data stream is coded as a run length limited coded signal prior to generation of the isolator signaling pattern.
26. The method of claim 16, wherein the isolator signaling pattern includes a gap of transmission inactivity that frames the outputs from the ADCs.

27. The method of claim 16, wherein the isolator signaling pattern includes a header signal that frames the outputs from the ADCs.

28. The method of claim 16, wherein the at least two ADCs include a first ADC and a second ADC, and wherein generating multi-bit outputs of different bit widths using at least two ADCs includes:
operating the first ADC according to a uniform quantization step size and operating the second ADC according to a non-uniform quantization step size.

29. The method of claim 16, wherein the at least two ADCs include a first ADC and a second ADC, and wherein generating multi-bit outputs of different bit widths using at least two ADCs includes:
generating a first digital output of the first ADC at a first conversion rate and generating a second digital output of the second AI)C at a second conversion rate that is different from the first conversion rate.

30. The method of claim 16, wherein transmitting the isolator signaling pattern across an isolation barrier includes:
asynchronously transmitting the isolator signaling pattern across an isolation barrier.

31. The isolator system of claim 1, wherein the signal combiner is configured to asynchronously merge outputs of the ADCs into a single data stream.

32. The isolator system of claim 1, wherein the at least two ADCs include a first ADC having a faster conversion rate than a conversion rate of a second ADC.

33. The isolator system of claim 32, wherein the signal combiner is configured to merge output data from the first ADC representing a fault indication with output data from the second ADC.

34. The isolator system of claim 32, wherein the signal combiner is configured to replace output data from the second ADC with output data from the first ADC representing a fault indication.

35. An isolator system, comprising:
a plurality of analog to digital converters (ADCs), wherein at least two ADCs have different signal bandwidths,
a signal combiner to merge outputs of the ADCs into a single data stream, and
a signal isolator, bridging an isolation barrier, to carry the merged data stream from a first side of the isolation barrier to a second side of the isolation barrier.

36. The isolator system of claim 35, wherein the at least two ADCs include a first ADC and a second ADC, and wherein the first ADC is a sigma-delta ADC and the second ADC is a successive approximation register (SAR) ADC.

37. The isolator system of claim 35, wherein the at least two ADCs include a first ADC having a faster conversion rate than a conversion rate of a second ADC.

38. An isolator system, comprising:
a plurality of analog to digital converters (ADCs), wherein at least two ADCs have different noise floors,
a signal combiner to merge outputs of the ADCs into a single data stream, and
a signal isolator, bridging an isolation barrier, to carry the merged data stream from a first side of the isolation barrier to a second side of the isolation barrier.

39. The isolator system of claim 38, wherein the signal combiner is configured to synchronously merge outputs of the ADCs into a single data stream.

40. The isolator system of claim 38, wherein the at least two ADCs include a first ADC and a second ADC, and wherein the first ADC is a sigma-delta ADC and the second ADC is a successive approximation register (SAR) ADC.

41. An isolator system, comprising:
a plurality of analog to digital converters (ADCs), wherein at least two ADCs accept input signals having different spans,
a signal combiner to merge outputs of the ADCs into a single data stream, and
a signal isolator, bridging an isolation barrier, to carry the merged data stream from a first side of the isolation barrier to a second side of the isolation barrier.

42. The isolator system of claim 41, wherein the at least two ADCs include a first ADC and a second ADC, wherein the first ADC is coupled to a first reference voltage and the second ADC is coupled to a second reference voltage that is different than the first reference voltage.

43. The isolator system of claim 41, wherein the at least two ADCs include a first ADC and a second ADC, wherein the first ADC is coupled to a first front end circuit and the second ADC is coupled to a second front end circuit, wherein the first front end circuit and the second front end circuit have operational parameters that are different from each other.

44. The isolator system of claim 41, wherein the signal combiner is configured to synchronously merge outputs of the ADCs into a single data stream.

45. The isolator system of claim 41, wherein the at least two ADCs include a first ADC and a second ADC, wherein the first ADC is configured to generate a first data output having a first data rate and the second ADC is configured to generate a second data output having a second data rate different from the first data rate.

46. An isolator system, comprising:
a plurality of analog to digital converters (ADCs), wherein at least two ADCs have different architectures,
a signal combiner to merge outputs of the ADCs into a single data stream, and
a signal isolator, bridging an isolation barrier, to carry the merged data stream from a first side of the isolation barrier to a second side of the isolation barrier.

47. The isolator system of claim 46, wherein the at least two ADCs include a first ADC and a second ADC, and wherein the first ADC is a sigma-delta ADC and the second ADC is a successive approximation register (SAR) ADC.

48. The isolator system of claim 46, wherein the at least two ADCs include a flash ADC.

49. The isolator system of claim 46, wherein the at least two ADCs include a pipeline ADC.

* * * * *

UNITED STATES PATENT AND TRADEMARK OFFICE
CERTIFICATE OF CORRECTION

PATENT NO. : 9,584,147 B2
APPLICATION NO. : 14/831731
DATED : February 28, 2017
INVENTOR(S) : Glibbery et al.

It is certified that error appears in the above-identified patent and that said Letters Patent is hereby corrected as shown below:

On page 2, in Column 2, under "Other Publications", Line 6, delete "Sgma-Delta" and insert --Sigma-Delta-- therefor In Column 15, Line 65, in Claim 6, before "architectures.", insert --different--

In Column 16, Line 48, in Claim 21, delete "rein" and insert --wherein-- therefor In Column 17, Line 17, in Claim 29, delete "AI)C" and insert --ADC-- therefor Signed and Sealed this
Seventeenth Day of April, 2018

Andrei Iancu
*Director of the United States Patent and Trademark Office*